United States Patent
Lin et al.

(10) Patent No.: US 7,312,486 B1
(45) Date of Patent: Dec. 25, 2007

(54) STRIPE BOARD DUMMY METAL FOR REDUCING COUPLING CAPACITANCE

(75) Inventors: Kang-Cheng Lin, Yunghe (TW); Chin-Chiu Hsia, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1189 days.

(21) Appl. No.: 10/189,910

(22) Filed: Jul. 5, 2002

(51) Int. Cl.
  *H01L 29/80* (2006.01)
(52) U.S. Cl. ............... 257/270; 257/250; 257/286; 257/750; 438/692
(58) Field of Classification Search ............ 257/5, 257/88, 225, 286, 270, 750; 438/692, 693
  See application file for complete search history.

(56) References Cited

U.S. PATENT DOCUMENTS

| 5,667,923 A * | 9/1997 | Kanata ............ 430/30 |
| 5,798,298 A | 8/1998 | Yang et al. ............ 438/622 |
| 5,915,201 A | 6/1999 | Chang et al. ............ 438/631 |
| 5,924,006 A | 7/1999 | Lur et al. ............ 438/626 |
| 5,929,528 A | 7/1999 | Kinugawa ............ 257/776 |
| 2001/0030372 A1 * | 10/2001 | Mori et al. ............ 257/903 |

* cited by examiner

*Primary Examiner*—Lan Vinh
(74) *Attorney, Agent, or Firm*—Thomas, Kayden, Horstemeyer & Risley

(57) ABSTRACT

Dishing is known to be a problem after CMP of dielectric layers in which the distribution of embedded metal is non-uniform. This problem has been solved by populating those areas where the density of embedded metal is low with unconnected regions that, instead of being uniformly filled with metal, are made up of metallic patterns whose combined area within a given region is about half the total area of the region itself. Two examples of such patterns are a line stripe pattern (similar to a parquet flooring tile) and a checker board pattern. Data is presented comparing the parasitic capacitances resulting from the use of patterns of this type relative to conventional solid patterns. The effect of aligning the regions so as to reduce their degree of overlap with wiring channels is also discussed.

16 Claims, 6 Drawing Sheets

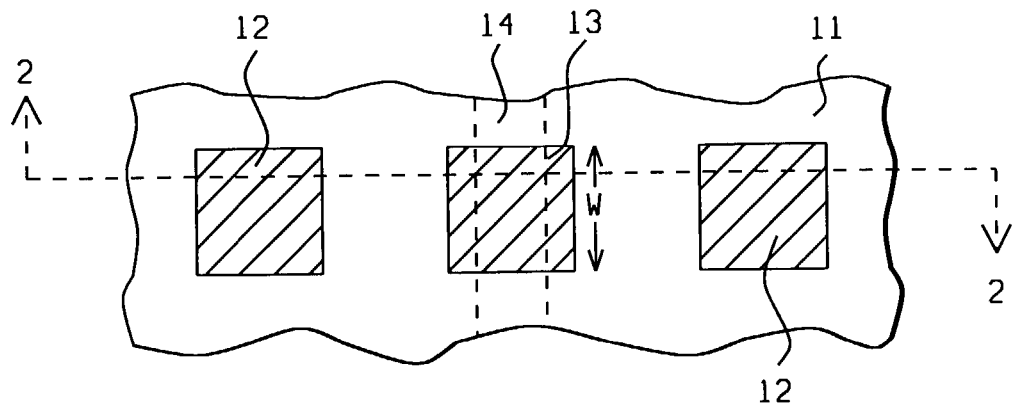
*FIG. 1 - Prior Art*
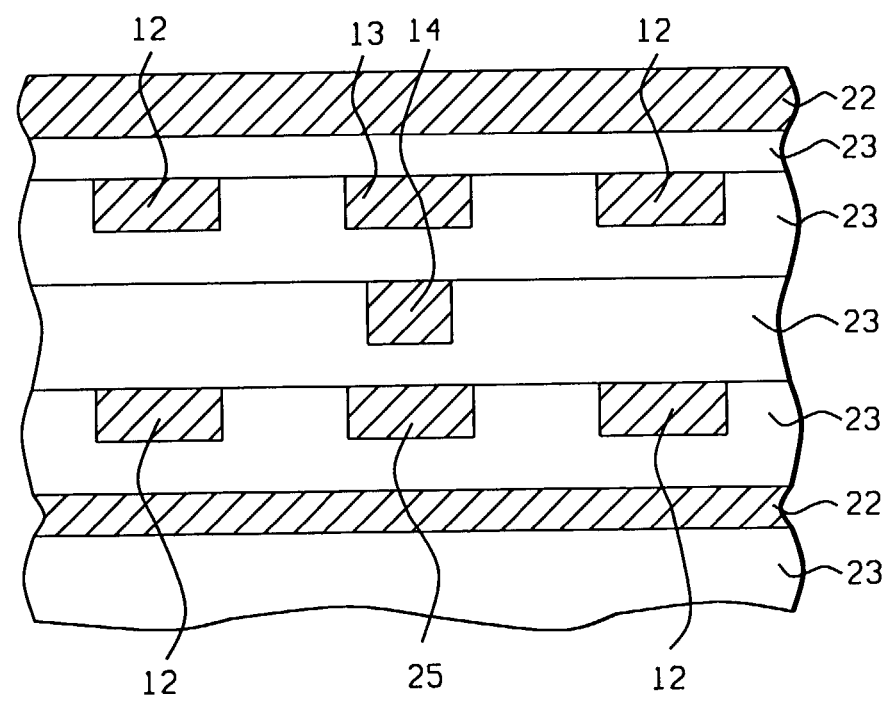
*FIG. 2 - Prior Art*

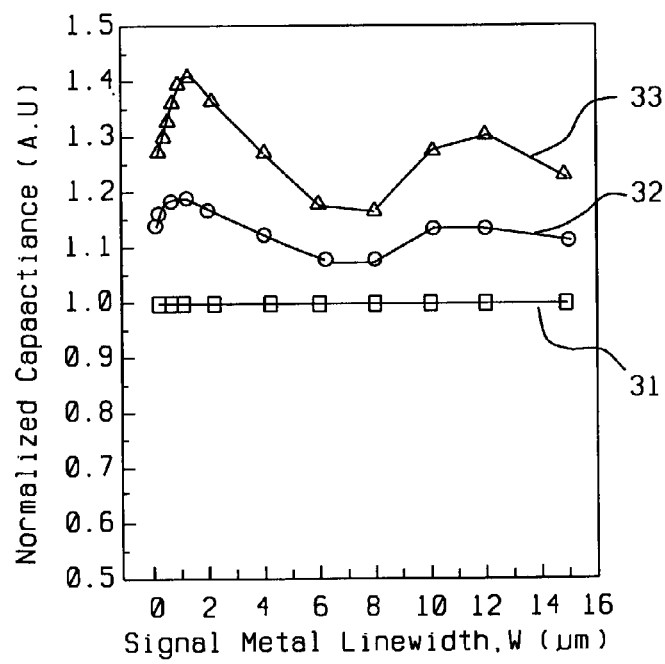
FIG. 3 – Prior Art
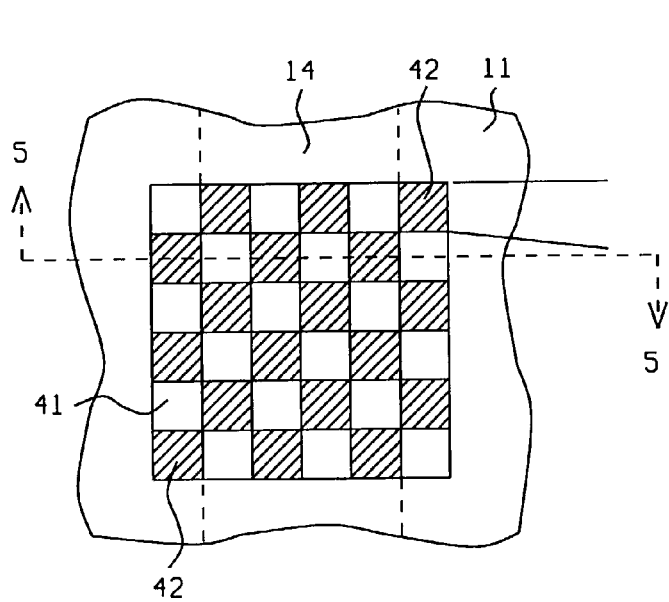
FIG. 4a
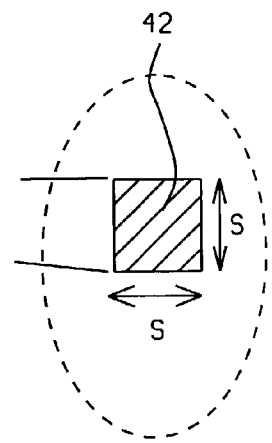
FIG. 4b

STRIPE BOARD DUMMY METAL FOR REDUCING COUPLING CAPACITANCE

FIELD OF THE INVENTION

The invention relates to the general field of chemical mechanical polishing with particular reference to the avoidance of dishing and capacitive coupling problems.

BACKGROUND OF THE INVENTION

Because of the large number of layers needed to produce an integrated circuit, it has become standard practice to introduce a planarizing step at regular intervals. The most widely used technique for this has been chemical mechanical polishing (CMP). CMP continues to be the etch method of choice because the etch front associated with it tends to be planar, regardless of the initial topography of the surface.

It is, however, well known that, during CMP, etching tends to proceed at a faster rate over regions that are softer than surrounding regions. This leads to a 'dishing' problem in which undesired concavities are obtained in a surface after it has been subjected to CMP, said concavities being associated with relatively large areas of metal imbedded in a dielectric. Where metal areas are of limited area and relatively densely distributed across the face of the dielectric, erosion is another problem.

In practice it is not always possible to control wiring layouts to a sufficient extent as to ensure that the density of embedded metal is uniform across the entire chip area. In such situations, dishing and erosion are likely to occur in those areas where the density of embedded metal is relatively high. One way of dealing with this problem has been to introduce unconnected 'dummy' islands of metal into those parts of a given layer where the metal density would otherwise be low enough to cause dishing in the high density areas. In general, it has been found effective to add such islands wherever the areal density of metal is less than about 10 percent.

FIG. 1 shows a small portion of the upper surface of a partially completed integrated circuit 11. The areal density of metal in this part of the structure is low enough, relative to other parts, for dishing to be a potential problem so dummy islands 12 and 13, of width W, have been added, as discussed above. In this particular example, however, it is the case that a line of metallic wiring 14 was already present in a lower layer and that one of the dummy islands (13) happens to lie directly above it. Such a situation is undesirable, however, because of capacitive coupling between 13 and 14.

FIG. 2 is a cross-sectional view of FIG. 1 taken at plane 2-2. This shows multiple dielectric layers 23 as well as wiring line 14 and dummy islands 12 and 13. Also seen are two ground planes 22.

FIG. 3 illustrates the additional parasitic capacitance (normalized arbitrary units plotted as a function of the width of a signal line such as 14 in FIGS. 1 and 2) that can result when a dummy island such as 13 and/or 25 is included in the structure. Curve 31 is for the case where no dummy islands are present. Curve 32 is for the case where there is only a single dummy island (either 13 or 25, but not both) while curve 33 is the case where there are two dummy islands (13 and 25) involved, one above and one below the signal line. This data shows that an increase in parasitic capacitance of over 40% is possible in some cases, with an increase of about 20% being typical.

Thus, there is a need for a process that minimizes CMP dishing in areas of relatively high metal density without at the same time introducing excessive parasitic capacitance.

A routine search of the prior art was performed with the following references of interest being found:

U.S. Pat. No. 5,798,298 (Yang et al.) shows a process to provide dummy lines to reduce dishing problems during CMP. In U.S. Pat. No. 5,924,066, Lur et al. show a dummy metal pattern with voids introduced into the dielectric between lines to lower the capacitance between adjoining lines (as opposed to superposed lines). U.S. Pat. No. 5,915,201(Chang et al.) take a similar approach to Lur et al. as just described. Kinugawa, in U.S. Pat. No. 5,929,528, teaches that dummy patterns and wiring must not overlap at all.

SUMMARY OF THE INVENTION

It has been an object of at least one embodiment of the present invention to reduce dishing during CMP of dielectric layers in which the density of embedded metallic areas is not uniform.

Another object of at least one embodiment of the present invention has been to provide a process for reducing dishing during CMP of dielectric layers in which the density of embedded metallic areas is not uniform, without introducing a significant amount of parasitic capacitance.

Still another object of at least one embodiment of the present invention has been to provide a structure that is suitable for CMP in which parasitic capacitances have been minimized.

These objects have been achieved by populating areas where the density of embedded metal is low with unconnected regions that, instead of being uniformly filled with metal, are made up of metallic patterns whose combined area within a given region is about half the total area of the region itself Two examples of such patterns are a line stripe pattern (similar to a parquet flooring tile) and a checker board pattern Data is provided comparing the parasitic capacitances resulting from the use of patterns of this type relative to conventional solid patterns. The effect of aligning the regions so as to reduce their degree of overlap with wiring channels is also discussed.

BRIEF DESCRIPTION OF THE DRAWINGS

FIG. 1 shows a prior art arrangement of dummy metal islands that are added to areas having a low density of metal as a way to minimize dishing.

FIG. 2 is a cross-section through FIG. 1

FIG. 3 compares parasitic capacitances for several configurations of dummy metal FIGS. 4a and 4b show how a checker board arrangement can be used to minimize both dishing as well as coupling capacitance FIG. 5 is a cross-section through FIG. 4a.

DESCRIPTION OF THE PREFERRED EMBODIMENTS

Figure 5:
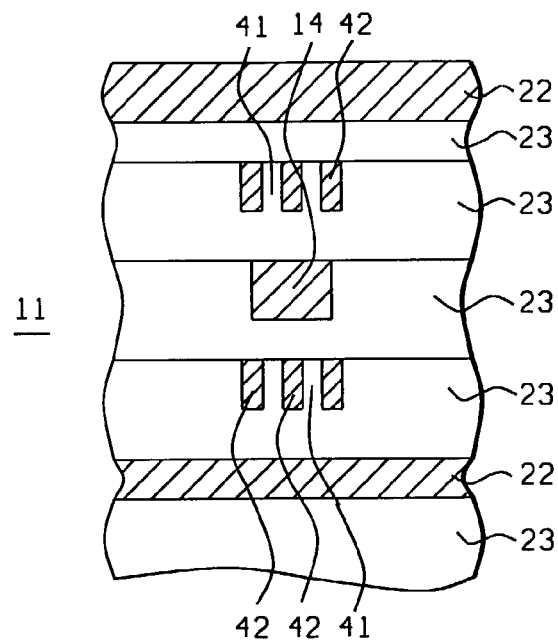

Referring now to FIG. 4a, we show there a single dummy island 41, similar to the dummy islands of the prior art with one key important difference. This is that only about half of the area of 41 contains metal, with the remaining portions still being dielectric material In the example shown in FIG. 4a the limitation that the dummy island be only half metal was achieved by replacing the solid, metal-filled, island seen in FIG. 1 with an assemblage of small (mini) square metal areas (width S as seen in FIG. 4b), exemplified in the figure as 42. These mini squares are arranged so that they touch, in checker board fashion, only at their corners FIG. 5 is a cross-section through FIG. 4 at plane 5-5.

Figures 6A, 6B:
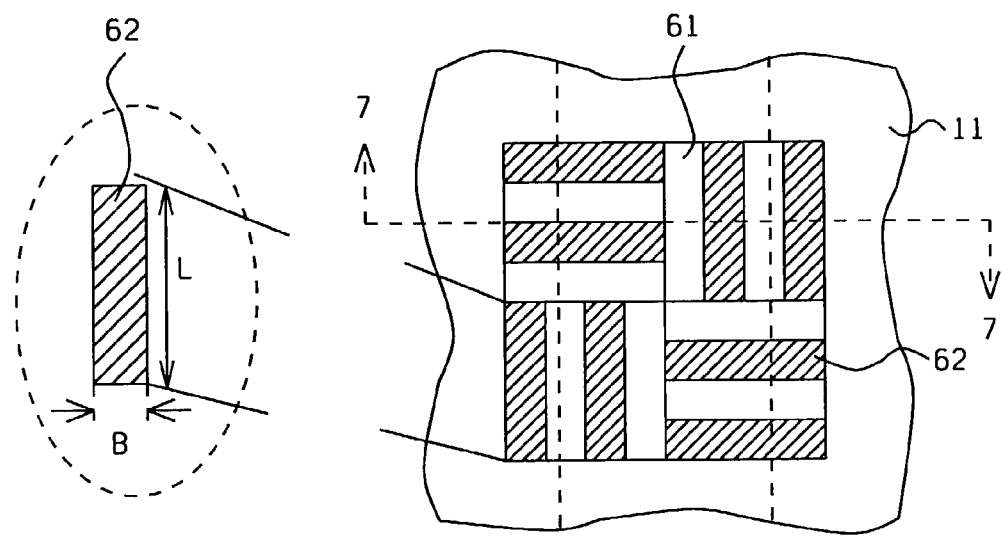
FIGS. 6a and 6b show how a stripe-board arrangement can be used to both minimize dishing as well as coupling capacitance
Figure 7:
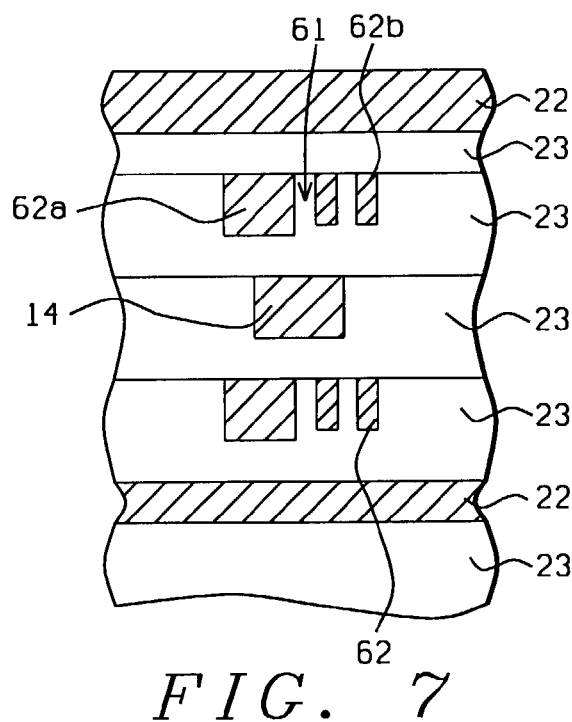
FIG. 7 is a cross-section through FIG. 6a FIG. 8 compares coupling capacitances for several dummy designs.

A different way to achieve the same function for the islands (that is having only half their area be of metal) is the stripe board design illustrated in FIGS. 6a/b In this case the metallic portion is in the form of an assemblage of metal rectangles 62 each of width B and length L, where L is half of W (defined in FIG. 1) Rectangles 62 all run parallel to the sides of the island and are spaced a distance B apart marked as spaces 61 in the figure). This type of design has a counterpart in the macro world as parquet flooring tiles. FIG. 7 is a cross-section through FIG. 6 taken through plane 7-7.

Figure 8:
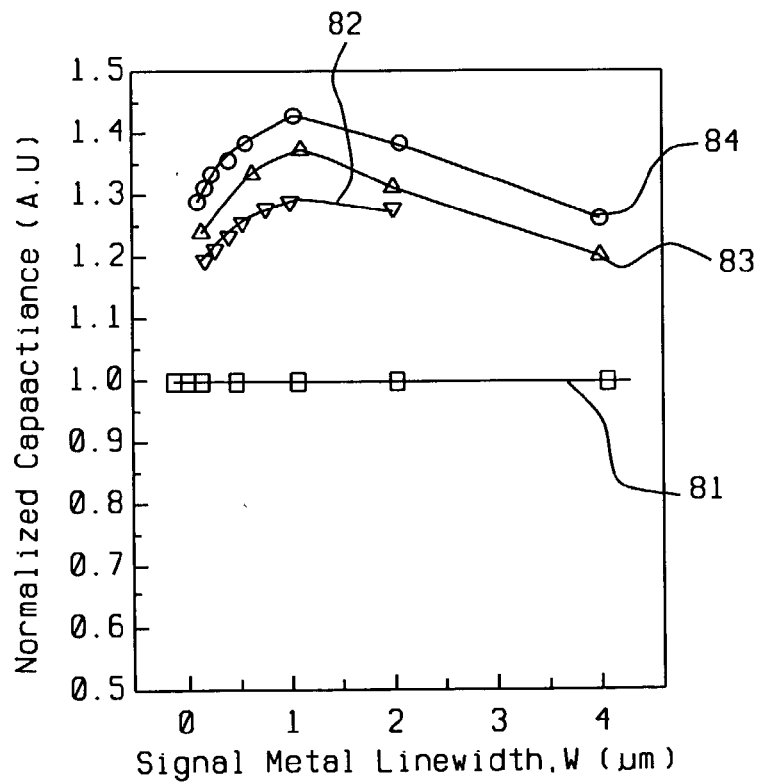

In FIG. 8 we compare parasitic capacitances due the presence of various island designs. Curve 81 (against which the other curves have been normalized) is for a line of wiring with no islands either above or below it. Curve 82 is a line of wiring with stripe-board islands both above and below it. Curve 83 is for checker board islands both above and below the line while curve 84 is for solid islands (i.e. prior art design) both above and below the wire.

Note that the two designs presented above are merely examples of the more general principle that, if the fraction of metal in the islands is less than about half, dishing can still be eliminated while parasitic capacitance can also be substantially reduced. Additionally, depending on how much dishing can be tolerated, the percentage of metal in the islands could be reduced still further so as to effect additional reductions in parasitic capacitance.

It is also important to note that, regardless of the details of the design, it is advantageous (though not essential) that each member of the assemblage making up the design have a minimum dimension that approximates the critical dimension of the overall design; that is, a width that is approximately equal to the minimum width of all features present in the integrated circuit. This will serve to smooth out the area 'seen' by the CMP pad so that there is no local dishing within the pattern itself.

Figure 9:
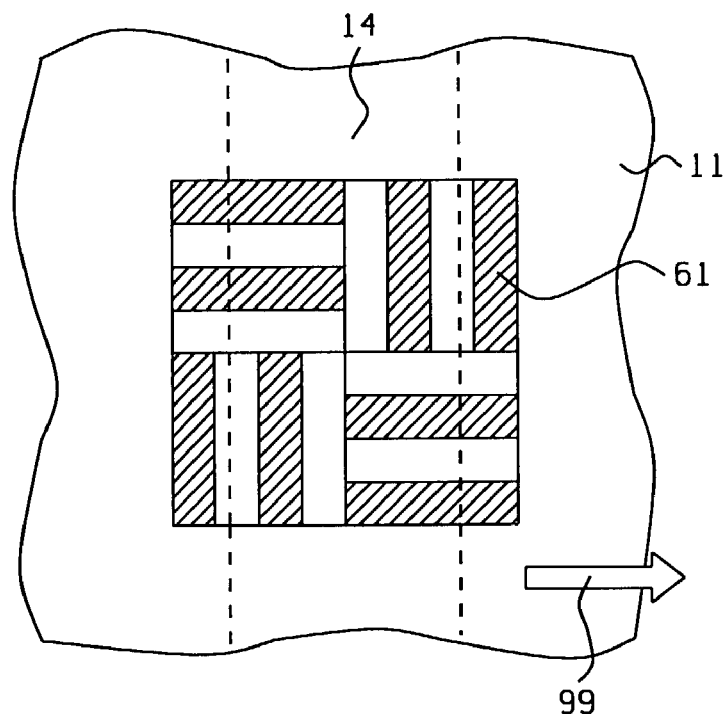
FIG. 9 illustrates how a stripe-board dummy design can be aligned so as to reduce or eliminate overlap with a wiring stripe FIG. 10 plots coupling capacitance as a function of extent of overlap of the stripe-board design for two different wiring channel widths.
Figure 10:
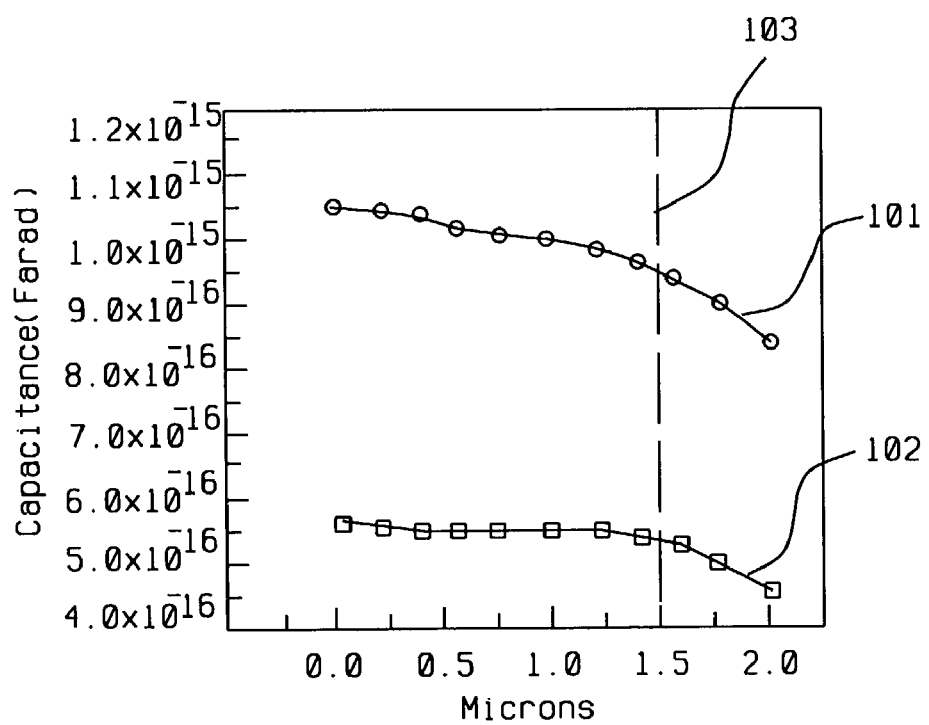
Figure 11:
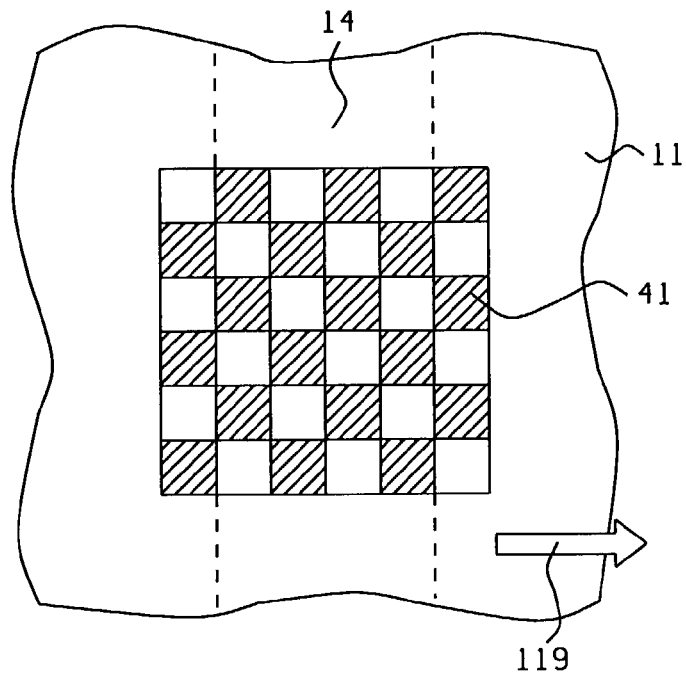
FIG. 11 illustrates how a checker board dummy design can be aligned so as to reduce or eliminate overlap with a wiring stripe.
Figure 12:
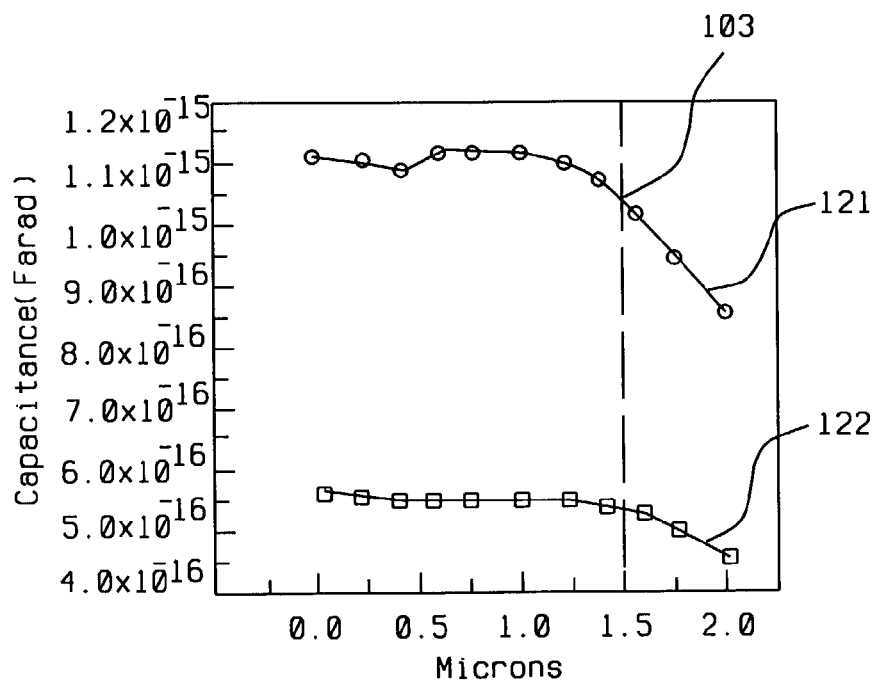
FIG. 12 plots coupling capacitance as a function of extent of overlap of the checker board design for two different wiring channel widths.

The approach disclosed above adds little to the cost of the overall process. However, in cases where it is necessary to reduce or fully eliminate coupling capacitance with the islands, this can be accomplished, at the cost of an additional process step, by aligning the islands so that there is little or no overlap with the conductive wiring lines. This is illustrated in FIGS. 9 and 11 where arrows 99 and 119 represent lateral movement of wiring line 14 relative to a stripe-board island in FIG. 9 and a checker-board island in FIG. 11. FIGS. 10 and 12 show the actual capacitance in Farads that exists between an island that is 3 micron on a side and a wiring stripe 14 that is 2 microns wide, as the latter is moved to the right. The X-axis scale is the distance in microns that the center of stripe 14 has been moved. In both figures line 103 marks the location of the right hand edge of the island.

In FIG. 10, curve 101 is for the case where line 14 was 1 micron wide while curve 102 is for a wiring stripe that was 0.14 microns wide. Similarly for curves 121 and 122, respectively, in FIG. 12. As can be seen, once the center of the island no longer overlies the wiring stripe, the coupling capacitance starts to fall off rapidly. This suggests that precise alignment between islands and stripe is not critical as long as less than half the island area overlaps the stripe.

The process for manufacturing the structure of the present invention is as follows:

Starting with a partially completed integrated circuit 11, a plurality of wiring channels in the form of trenches is formed in its topmost dielectric layer 23. Our preferred dielectric material has been silicon oxycarbide ($SiO_xC_y$) but any similar material such as undoped silicate glass (USG), fluorinated silicate glass (FSG), silicon oxide ($SiO_x$), silicon carbide (SiC), and spin-on glass (SOG) could have been used instead. A determination is made as to the density of such wiring channels in different parts of the surface which is then divided into high density and low density areas. Generally, the lower areal density is between about 10 and 50 percent of the higher areal density An array of unconnected regions is formed in the low density areas at an areal density that approximates that of the high density area. Each region will normally be a square measuring about 2 by about 2 microns on a side. As a key feature of the invention, each such region consists of an assemblage of mini cavities uniformly distributed within the region and having a total area, within each region, that is about half that of the region. These mini cavities are formed to a depth of between about 0.1 and 1 microns. Although it is not a requirement for the invention to operate successfully, it is generally convenient to form the wiring channels and the mini cavities at the same time and therefore to the same depth.

As already discussed above, these mini cavities can have any of many possible shapes arranged to form any of many possible patterns, provided their combined area is less than about half the area of the region. Two examples, described in detail above, are the parquet tile and checker board patterns.

Once these mini cavities have been formed, both they and the wiring channels are overfilled with a layer of metal such as Cu or Al, following which CMP is performed until all metal not inside the wiring channels and the mini cavities has been removed.

What is claimed is:

1. A structure suitable for chemical mechanical polishing, comprising:

a partially completed integrated circuit including an upper layer that is a dielectric and that has a top surface;

a plurality of metal-filled wiring trenches in said surface whereby, in a first part, the trenches are present at a first areal density and, in a second part, the trenches are present at a second areal density that is less than said first areal density; and in said second part, an array of unconnected regions across the top surface of the dielectric, whose areal density approximates said first areal density, each unconnected region further comprising an assemblage of unconnected dummy metal-filled mini cavities uniformly distributed within the unconnected region and having a combined area that is about half that of the unconnected region.

2. The structure described in claim 1 wherein said dielectric is selected from the group consisting of SiOxCy USG, FSG, SiOx, SiC, and SOG.

3. The structure described in claim 1 wherein said metal is selected from the group consisting of Cu and Al.

4. The structure described in claim 1 wherein said second areal density is up to about 70 percent of said first areal density.

5. The structure described in claim 1 wherein each unconnected dummy metal-filled mini cavity has a width that is approximately equal to the minimum width of all features present in said integrated circuit.

6. The structure described in claim 1 further comprising a layer of metal wiring below said dielectric layer.

7. The structure described in claim 1 further comprising a layer of metal wiring above said dielectric layer.

8. A structure suitable for chemical mechanical polishing, comprising:
   a partially completed integrated circuit including an upper layer that is a dielectric and that has a top surface;
   a plurality of metal-filled wiring trenches in said surface whereby, in a first part, the trenches are present at a first areal density and, in a second part, the trenches are present at a second areal density that is less than said first areal density; and
   in said second part, an array of unconnected square regions across the top surface of the dielectric whose areal density approximates said first areal density, each unconnected square region further comprising an assemblage of unconnected dummy square metal-filled mini cavities that touch, in checker board fashion, at their corners.

9. The structure described in claim 8 wherein said second areal density is up to about 70 percent of said first areal density.

10. The structure described in claim 8 wherein each unconnected dummy metal-filled mini cavity has a width that is approximately equal to the minimum width of all features present in said integrated circuit.

11. A structure suitable for chemical mechanical polishing, comprising:
    a partially completed integrated circuit including an upper layer that is a dielectric and that has a top surface;
    a plurality of metal-filled wiring trenches in said surface whereby, in a first part, the trenches are present at a first areal density and, in a second part, the trenches are present at a second areal density that is less than said first areal density;
    in said second part, an array of unconnected square-sided regions, having a first width and an areal density that approximates said first areal density, each unconnected square-sided region further comprising an assemblage of unconnected dummy rectangular metal-filled mini cavities each having a second width and a length that is half said first width; and
    said unconnected dummy metal-filled mini cavities being disposed to run parallel to the sides of said unconnected square-sided region and being spaced apart a distance equal to said second width whereby said unconnected dummy metal-filled mini cavities have a combined area that is about half that of the unconnected square-sided region.

12. The structure described in claim 11 wherein said second areal density is up to about 70 percent of said first areal density.

13. The structure described in claim 11 wherein each unconnected dummy metal-filled mini cavity has a width that is approximately equal to the minimum width of all features present in said integrated circuit.

14. A structure suitable for chemical mechanical polishing, comprising:
    a partially completed integrated circuit including an upper layer that contains one or more embedded wires;
    on said upper layer a dielectric layer that has a top surface;
    a plurality of metal-filled wiring trenches in said surface whereby, in a first part, the trenches are present at a first areal density and, in a second part, the trenches are present at a second areal density that is less than said first areal density; and
    in said second part, an array of unconnected regions across the top surface of the dielectric, whose areal density approximates said first areal density, each unconnected region further comprising at least one unconnected dummy metal-filled mini cavity, said region being aligned so that less than half their width overlies said embedded wires whereby capacitive coupling between said unconnected dummy metal-filled mini cavity and said embedded wires is minimized.

15. The structure described in claim 14 wherein each said unconnected region further comprises a square assemblage of square unconnected dummy metal-filled mini cavities that touch, in checker board fashion, at their corners.

16. The structure described in claim 14 wherein each of said unconnected regions is a square having a first width and further comprises an assemblage of rectangular unconnected dummy metal-filled mini cavities each having a second width and a length that is half said first width, said metal-filled mini cavities being disposed to run parallel to the sides of said unconnected square region and being spaced a distance equal to said second width apart from one another whereby said unconnected dummy metal-filled mini cavities have a combined area that is about half that of the unconnected square region.

* * * * *